United States Patent [19]

Damiano et al.

[11] Patent Number: 4,599,555
[45] Date of Patent: Jul. 8, 1986

[54] SOLID STATE DC POWER CONTROL SYSTEM

[75] Inventors: Michael A. Damiano, Germantown; Dennis M. Kramer, Brookfield; Richard F. Schmerda, Oak Creek, all of Wis.

[73] Assignee: Eaton Corporation, Cleveland, Ohio

[21] Appl. No.: 693,700

[22] Filed: Jan. 22, 1985

[51] Int. Cl.[4] ............................................. H03K 17/687
[52] U.S. Cl. ........................................ 323/351; 307/571
[58] Field of Search .................... 323/282, 283, 351; 307/571, 580, 584, 304

[56] References Cited

U.S. PATENT DOCUMENTS

| 4,420,700 | 12/1983 | Fay et al. | 323/351 X |
| 4,445,055 | 4/1984 | Bete | 323/351 X |
| 4,471,245 | 9/1984 | Janutka | 307/571 |

FOREIGN PATENT DOCUMENTS

| 0104830 | 6/1984 | Japan | 307/571 |

OTHER PUBLICATIONS

International Rectifier Hexfet Databook, 1982-83, First Printing pp. A-1, A-46, A-47, A-60, A-61.

*Primary Examiner*—Peter S. Wong
*Attorney, Agent, or Firm*—C. H. Grace; W. A. Autio

[57] ABSTRACT

A solid state DC power control system having a single N-type or N-channel or majority carrier solid state switching element (Q1) connected to the high side (L) of the power supply for energizing a ground or neutral ($V_o$) connected load (LD). A voltage level translation circuit (2,2') supplies a floating regulated control voltage to the switching element (Q1) high enough to maintain it turned on even if the voltage at the low side of the switching element (Q1) rises up to or near the supply voltage thereby allowing use of such N-type switching device (Q1) in the high side (L) of the supply. A zener diode (ZD3) limits the gate(G)-to-source(S) voltage to the proper level. A non-inverting drive circuit (10,12) controlled by a logic level signal input element (Q2) controls connection of the high voltage to the switching (Q1) gate (G). A first version uses a DC-DC converter (CON) and a preferred version uses a voltage multiplier (VM) in the voltage level translation, high voltage, gate supply circuit (2,2').

7 Claims, 3 Drawing Figures

SOLID STATE DC POWER CONTROL SYSTEM

BACKGROUND OF THE INVENTION

Prior art solid state power control systems have generally required that the power switch be connected in the neutral leg of the power supply. A few systems using minority carrier switch devices such as, for example, P-channel MOSFETs, have allowed the power switch to be connected in the high side of the line; however, the size and power dissipation of such minority carrier devices has been excessive. For this reason, it has been found desirable to use majority carrier devices, such as, for example, N-channel MOSFETs or the like, due to their small size lower cost and low power dissipation and to design a means for allowing connection of the same in the high side of the line.

The typical placement of an N-type power device is the neutral side of a DC supply since the N-type devices require that a positive voltage bias or control voltage be provided between the gate and source for a FET or between the base and emitter for a bipolar transistor. Typical drive circuits of this type are shown in International Rectifier's 1982-1983 Databook, FIGS. 17, 18 and 19 on page A-46. Circuits for supplying gate drive voltage when the power switching device is in the line side or high voltage side are shown in FIGS. 20, 21, 22 and 23 of the aforementioned Databook on pages A-46 and A-47. Each of these circuits requires either a separate gate supply, a low duty cycle or excessive leakage to the load when the device is off since the supply is returned only to the FET source terminal. For these reasons, it has been accepted practice to use P-type switch devices that require a negative gate bias voltage, either FETs or bipolar transistors, when a ground connected load is desired. P-channel MOSFET circuits are shown in International Rectifier's 1982-1983 Databook, FIGS. 1 through 3(b), pages A-60 and A-61.

To overcome the aforementioned handicaps of the prior art circuits, this invention relates to improvements thereover. Because of its low RDS(on) of drain-to-source resistance in the on condition, an N-channel FET is the desirable FET switching device in low voltage DC power controller applications as compared with the P-channel FET. However, the gating means is complicated since the gate voltage must rise about 15 volts above its source terminal voltage which rises near or to about 28 volts (the supply voltage level) when the FET is fully on. This problem is overcome by the invention in an efficient and economical manner.

SUMMARY OF THE INVENTION

An object of the invention is to provide an improved solid state DC power control system.

A more specific object of the invention is to provide a solid state DC power control system with an improved step-up gating or control voltage means which allows use of an N-type solid state switching device in the high voltage side of the line with the load being connected to the common or low voltage side of the line.

Another specific object of the invention is to provide a solid state DC power control system with an improved DC-DC converter controlled step-up gating or control voltage supply for control of an N-type solid state switching device in the high voltage side of the line.

Another specific object of the invention is to provide a solid state DC power control system with an improved AC voltage multiplier controlled step-up gating or control voltage supply for control of an N-type solid state switching device in the high voltage side of the line.

Another specific object of the invention is to provide a solid state DC power control system of the aforementioned type with improved means for turn-on and turn-off and regulation of such gating or control voltage supply to the N-type solid state switching device.

Other objects and advantages of the invention will hereinafter appear.

These and other objects of the invention are attained by providing a solid state DC power control system comprising a DC power supply having high voltage side and a low voltage side and a predetermined power supply voltage, a solid state switching device having high side and low side power terminals and a control terminal requiring a control voltage that is a predetermined amount higher than its low side voltage and being connected high voltage side and a low voltage side and to control energization of said, voltage increasing means energized from said power supply independently of any input signal for providing a control voltage significantly higher in value than said substantially constant power supply voltage, input control means responsive to a logic level input signal for applying said control voltage on or off said control terminal thereby to render said switching device conducting or non-conducting, and means regulating the magnitude of said control voltage applied across said control terminal and said low side power terminal so as to limit it to or maintained it at a value sufficient to maintain said switching device conducting despite variation in said low side voltage upon energization of said load.

DESCRIPTION OF THE PREFERRED EMBODIMENTS

Figure 1:
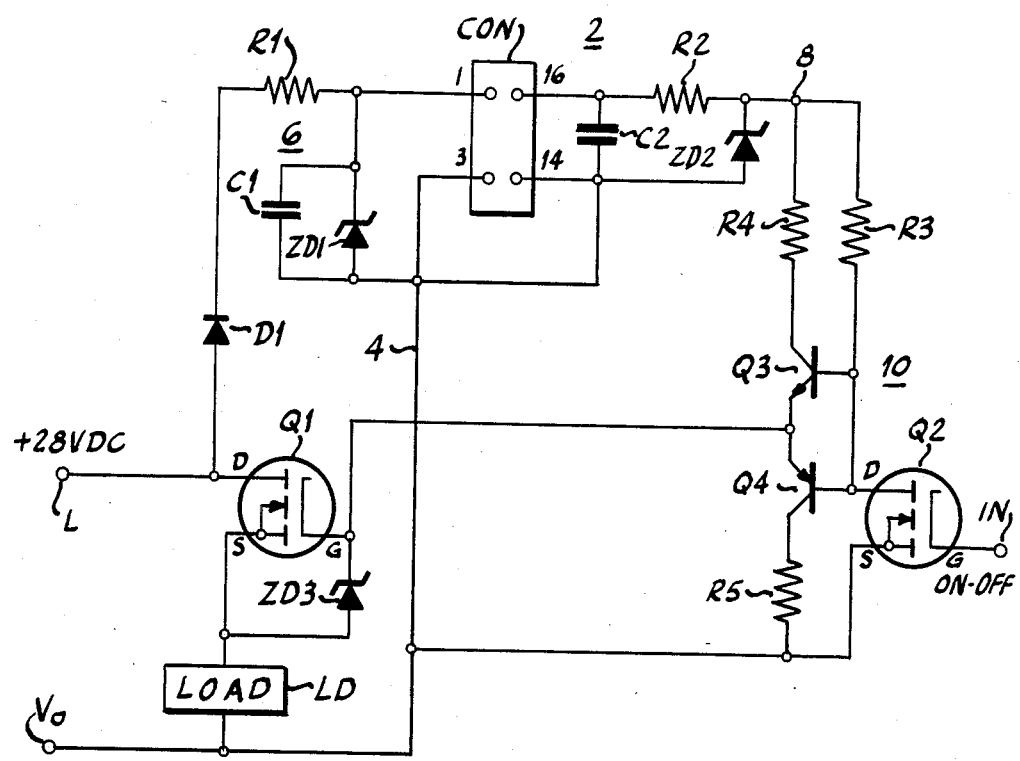
FIG. 1 is a circuit diagram of a solid state DC power control system using a DC-DC converter in the gate control circuit of the power switching FET.

Referring to FIG. 1, there is shown a first version of a solid state DC power control system constructed in accordance with the invention. As shown therein the system is provided with a plus 28 volt DC power supply connected between line L and common or ground terminal $V_o$. An N-channel field effect transistor (FET) Q1 is connected through its drain D and source S terminals and load LD across the DC supply. Since power transistor Q1 is connected in the high voltage side or line L side of the power supply with load LD connected to the low voltage side or ground side of the power supply and the control or gate terminal G voltage must be 15 volts above the source terminal S voltage to maintain transistor Q1 on, a gate voltage supply higher by 15 volts than the 28 volt DC power supply is required. That is, in the on state, it is critical that a constant gate-to-source bias is provided in order that the power device Q1 remains on. If the source terminal S potential rises due to the on state voltage drop of the load, then the gate terminal G potential must also rise. For this purpose, a line-derived gate (or control) voltage supply circuit 2 is provided as shown at the upper portion of FIG. 1. In this circuit, DC supply line L is connected through a unidirectional diode D1, a current limiting resistor R1 and a voltage regulating zener diode ZD1 and conductor 4 to common side $V_o$ of the power supply. A filter capacitor C1 is connected across zener diode ZD1. This converter supply circuit 6 which includes diode D1, resistor R1, zener diode ZD1 and capacitor C1 is a power supply circuit that provides a voltage of the proper value such as 15 volts or the like to input terminals 1 and 3 of DC-DC converter CON. Converter CON may be a DC-DC voltage stepup device such as, for example, Integrated Circuits Inc. Model No. DCH1228D that functions in response to an input voltage of 12 volts DC to provide an output voltage at its output terminals 16 and 14 of 56 volts DC. The output voltage of converter CON is filtered by capacitor C2 and then applied through a current limiting resistor R2 to junction 8. The voltage at this junction 8 is regulated by a zener diode ZD2 which is connected between junction 8 and common terminal $V_o$ to 50 volts DC or the like so as to have sufficient substantially constant control supply voltage for gate control of FET Q1 independently of any input signal as hereinafter described.

The system in FIG. 1 is also provided with an on-off control circuit 10. This control circuit includes an input terminal IN connected to the gate of a field effect transistor Q2. This field effect transistor Q2 is connected to control a noninverting drive stage 10. This drive stage 10 comprises a circuit from high control supply voltage junction 8 through a current limiting resistor R3 and the base-emitter junction of an NPN transistor Q3 to gate terminal G of FET Q1. High control supply voltage junction 8 is also connected through a collector resistor R4 and the collector-emitter junction of transistor Q3 to gate terminal G of FET Q1. It will be apparent that transistor Q3 controls turn-on of FET Q1. For turn-off of FET Q1, gate G thereof is connected through the emitter-collector junction of a PNP transistor Q4 and a collector resistor R5 to common terminal $V_o$ of the power supply. For control of transistors Q3 and Q4, drain terminal D of FET Q2 is connected to the base of transistor Q3 and also to the base of transistor Q4 while source terminal S of FET Q2 is connected to common terminal $V_o$.

The operation of the system in FIG. 1 will now be described. The input of the system in FIG. 1 is arranged so that a logic level signal of 0–15 volts DC may be used to control the same. When 15 volts DC is applied to input terminal IN, FET Q2 is turned on, causing the base of transistor Q3 to be connected to ground thereby to keep this transistor turned off. At the same time the base of transistor Q4 is connected to ground to cause this transistor to be turned on. As a result, gate G of FET Q1 is connected through transistor Q4 and resistor R5 to ground to keep this power switching FET turned off.

For turn-on of power FET Q1, input terminal IN is switched to zero volts. As a result, FET Q2 turns off whereby high voltage is applied from junction 8 through resistor R3 to the base of PNP transistor Q4 to turn it off and thereby disconnect ground from gate G of FET Q1. At the same time, high control voltage is applied from junction 8 through resistor R3 to the base of NPN transistor Q3 to turn it on. This causes a high control supply voltage to be applied from junction 8 through resistor R4 and the collector-emitter junction of transistor Q3 to the gate G of FET Q1 to turn it on, this high control supply voltage being regulated to 15 volts DC or the like by zener diode ZD3 connected between gate terminal G and source terminal S of FET Q1.

In this on state, it is critical that a constant gate-to-source bias be provided in order that the power device Q1 remain on. If the source S voltage rises due to the on state voltage drop of load LD, then the gate G potential must also rise. The combination of converter CON, zener diode ZD2, resistor R4, transistor Q3 and zener diode ZD3 provide a tracking circuit which keeps the gate potential of FET Q1 15 volts above its source terminal S voltage or power supply voltage in its on state. As the nominal line voltage varies, a corresponding variation in voltage at the source terminal S of FET Q1 will be present for a fixed impedance load. A high control supply voltage such as 50 volts DC or the like is applied from junction 8 through resistor R4 and transistor Q3 to zener diode ZD3. Due to this high control supply voltage at junction 8, zener diode ZD3 maintains the gate G voltage 15 volts above the source S voltage so that power device Q1 remains conducting. This is the means which allows the gate supply of Q1 to the source S potential. Zener diodes ZD2 and ZD3 effectively clamp or regulate the gate-to-source differential voltage.

More specifically, when power switching transistor Q1 is first turned on by applying 15 volts to its gate, the voltage at its source terminal S begins to rise due to the current in the load and it rises from zero to whatever the supply voltage is, in this case plus 28 volts DC. At the same time, the voltage on the gate G of transistor Q1 must continue to rise because, in order for the FET to be turning on, there has to be a gate-to-source 15-volt differential. So by the time the source S rises to 28 volts DC, the gate has to rise to 43 volts DC which is 15 volts above it. The 50 volts at the high control voltage supply junction 8 is sufficient to supply it. Depending upon the characteristics of the load, the more inductive the load is, the faster the source S voltage will rise and the more capacitive the load is, the longer it will take for the source S voltage to rise and in this way the circuit accommodates the various load conditions in terms of impedance and power factor. It provides a floating gate supply above the power supply voltage. Thus, it allows one to use an N-channel FET as opposed to a P-channel FET on the high voltage side of the line, the P-channel devices having higher resistance for more power dissipation and being more costly. Therefore, the N-channel device provides a better system.

Figure 2:
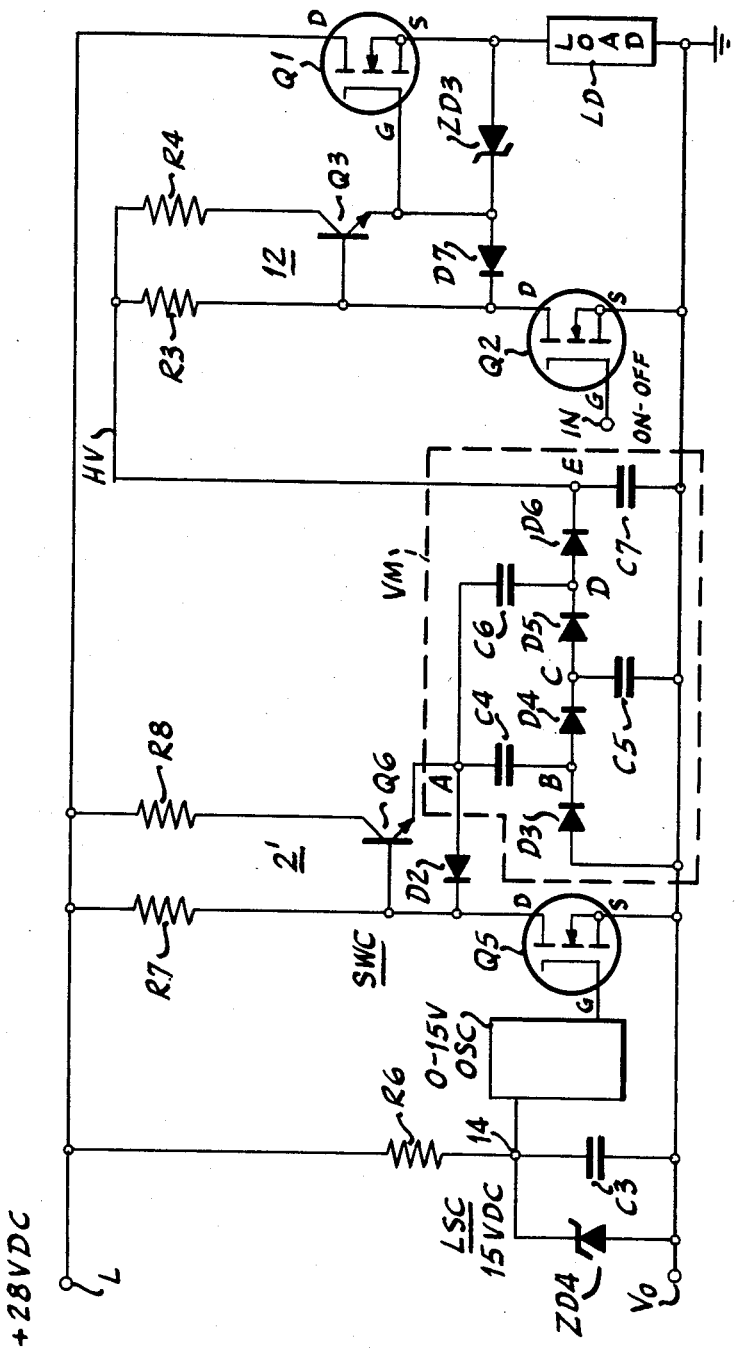
FIG. 2 is a circuit diagram of a preferred embodiment of a solid state DC power control system using a voltage multiplier in the gate control circuit of the power switching FET.

FIG. 2 shows a modification of the system of FIG. 1 which provides an improved version of the solid state DC power control system. Reference characters similar to those in FIG. 1 have been used in FIG. 2 for like elements. As shown in FIG. 2, a plus 28 volt DC supply is connected across line terminals L and $V_o$, line L being the high voltage side of the supply and line $V_o$ being the low voltage side of the supply. Line L is connected through the drain and source electrodes of an N-channel field effect transistor Q1 and load LD to the common or ground line $V_o$. Drive stage 12 has been modified, simplified and improved from that shown in FIG. 1 in that unidirectional diode D7 replaces transistor Q4 and resistor R5 of FIG. 1. In other respects, drive stage 12 in FIG. 2 is similar to drive state 10 in FIG. 1 in that input terminal IN is connected to the gate of field effect transistor Q2, high control supply voltage conductor HV is connected through resistor R3 to the base of NPN transistor Q3, high control voltage voltage conductor HV is connected through resistor R4 and the collector-emitter junction of transistor Q3 to gate G of field effect transistor Q1, zener diode ZD3 is connected between gate G and source terminal S of FET Q1, the drain D of FET Q2 is connected to the base of transistor Q3 and to the cathode of diode D7, and gate G of FET Q1 is connected through diode D7 in its forward low impedance direction and then through the drain D and source S terminals of FET Q2 to ground.

Figure 3:
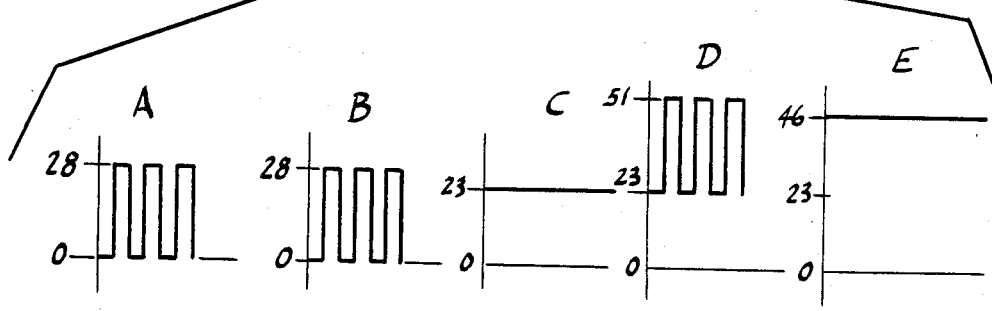
FIG. 3 is a graph showing operating characteristics of the circuit of FIG. 2.

The high gate or control voltage supply circuit 2' for power FET Q1 is shown at the left-hand and center portions of FIG. 2. This high control voltage supply circuit basically comprises a logic supply circuit LSC for providing a logic voltage level of 15 volts DC or the like, a 0–15 volt square wave oscillator OSC, a switching circuit SWC driven by oscillator OSC, and a voltage multiplier circuit VM. Current flows from line L through resistor R6 and zener diode ZD4 to provide 15 volts DC at junction 14 where it is filtered by capacitor C3 to provide an input voltage for oscillator OSC. The output of oscillator OSC is applied to gate G of FET Q5 to turn the latter on and off at the oscillator frequency. Each time that FET Q5 is turned on, transistor Q6 is turned off and point A in voltage multiplier circuit VM is low, as shown at the start of curve A in FIG. 3, by being grounded through diode D2 and the drain and source terminals of FET Q5. Alternatively, when FET Q5 is turned off, a voltage is applied from line L through resistor R7 to the base of transistor Q6 to turn it on thereby causing the voltage at point A to go high as shown next by curve A in FIG. 3. As shown by curve A in FIG. 3, switching circuit SWC then continues to provide a square wave at the oscillator frequency, this square wave of voltage appearing at point A in the voltage multiplier circuit VM. The voltage square wave at point A is applied through capacitor C4 to provide a similar square voltage wave at point B in the voltage multiplier circuit in FIG. 2. This square voltage wave at point B causes current flow through diode D4 to charge capacitor C5 to a DC voltage as shown by curve C in FIG. 3, this voltage being somewhat lower than the supply voltage of 28 volts due to the voltage drop in diode D4 and a certain amount of discharge occuring whenever the square wave at point A is low. At the same time that point A is high, a square wave appears at point D, this square wave voltage being superimposed on the DC voltage of point C as shown by curve D in FIG. 3. This voltage at point D causes current flow through diode D6 to charge capacitor C7, thereby to provide a higher DC voltage at point E as shown by curve E in FIG. 3, this voltage being somewhat lower than twice the supply voltage due to the voltage drop in diode D6 and a certain amount of discharge when point A is low. As will be apparent, the voltage at point E is proportional to the supply voltage times the number of stages in voltage multiplier VM. This high control supply voltage at point E is then applied through high voltage conductor HV to drive stage 12.

For on-off control of FET Q1 in order to energize or deenergize load LD, a logic level signal is applied to input terminal IN, this logic level signal preferably being 0–15 volts DC as described in connection with FIG. 1. When the input signal is zero or low, the control supply voltage on high voltage conductor HV is applied through resistor R3 to the base of transistor Q3 to turn it on thereby gating FET Q1 causing it to turn on. Zener diode ZD3 regulates the gating voltage of FET Q1 to 15 volts and allows it to float in response to variation in the source terminal S voltage of Q1 as described in connection with FIG. 1. When the high input signal is applied to the gate, FET Q2 turns on and grounds the base of transistor Q3 to cause it to turn off. At the same time, gate G of FET Q1 is grounded through diode D7 and FET Q2 to cause it to turn off and thereby deenergize the load. From the foregoing, it will be apparent that a logic level 0–15 volts DC at input terminal IN can be used to turn FET Q1 on or off thereby to energize or deenergize the load.

While the apparatus hereinbefore described is effectively adapted to fulfill the objects stated, it is to be understood that the invention is not intended to be confined to the particular preferred embodiments of solid state DC power control systems disclosed, inasmuch as they are susceptible of various modifications without departing from the scope of the appended claims.

We claim:
1. A solid state DC power control system comprising:
 a DC power supply having a high voltage side and a low voltage side and predetermined power supply voltage;
 a solid state switching device having high side and low side power terminals and a control terminal requiring a control voltage that is a predetermined amount higher than its low side voltage and being connected at its high side to said high voltage side and at its low side through a load to said low voltage side of said power supply to control energization of said load;

voltage increasing means energized from said power supply independently of any input signal for providing a substantially constant control supply voltage significantly higher in value than said power supply voltage;

input control means responsive to a logic level input signal for applying said control voltage on or off said control terminal thereby to render said switching device conducting or non-conducting;

and means regulating the magnitude of said control voltage applied across said control terminal and said low side power terminal so as to limit it to or maintain it at a value sufficient to maintain said switching device conducting despite variation in said low side voltage upon energization of said load.

2. The solid state DC power control system in claim 1, wherein:

said solid state switching device is an N-channel MOSFET.

3. The solid state DC power control system claimed in claim 1 wherein:

said voltage increasing means comprises a parallel voltage multiplier.

4. The solid state DC power control system claimed in claim 1, wherein:

said voltage increasing means comprises an unregulated DC to DC converter.

5. The solid state DC power control system claimed in claim 1, wherein:

said means regulating the magnitude of said control voltage comprises a zener diode connected between said control terminal and said low side power terminal.

6. The solid state DC power control system claimed in claim 1, wherein:

said voltage increasing means comprises means for providing a control voltage high enough to maintain said switching device conducting even if said low side voltage rises up to or near said power supply voltage.

7. The solid state DC power control system claimed in claim 1, wherein:

said input control means comprises a logic level input signal responsive device and drive means responsive thereto for applying said control voltage to said control terminal or grounding the latter according to whether the load is to be energized or deenergized.

* * * * *